United States Patent [19]
Hirose et al.

[11] Patent Number: 6,114,244
[45] Date of Patent: Sep. 5, 2000

[54] METHOD FOR MANUFACTURING A SEMICONDUCTOR DEVICE HAVING FINE CONTACT HOLE WITH HIGH ASPECT RATIO

[75] Inventors: Kazuyuki Hirose; Kuniko Kikuta, both of Tokyo, Japan

[73] Assignee: NEC Corporation, Tokyo, Japan

[21] Appl. No.: 08/910,020

[22] Filed: Aug. 12, 1997

Related U.S. Application Data

[62] Division of application No. 08/578,318, Dec. 26, 1995, Pat. No. 5,691,571.

[30] Foreign Application Priority Data

Dec. 28, 1994 [JP] Japan ......................................... 338719

[51] Int. Cl.[7] .................................................. H01L 21/44
[52] U.S. Cl. ......................... 438/688; 438/627; 438/637; 438/687
[58] Field of Search .................................... 438/624, 642, 438/687, 688, 626, 627, 633, 636, 637

[56] References Cited

U.S. PATENT DOCUMENTS

| | | | |
|---|---|---|---|
| 5,169,803 | 12/1992 | Miyakawa | 438/625 |
| 5,616,519 | 4/1997 | Ping | 438/626 |
| 5,763,954 | 6/1998 | Hyakutake | 257/774 |

*Primary Examiner*—Charles Bowers
*Assistant Examiner*—Reneé R. Berry
*Attorney, Agent, or Firm*—Hayes, Soloway, Hennessey, Grossman & Hage PC

[57] ABSTRACT

A semiconductor device includes at least one hole formed on a semiconductor substrate. A barrier method is formed on at least one portion in contact with the semiconductor substrate in the hole. A metal interconnection is constituted by two layers including a first Al-containing metal film formed on the barrier metal, and a second Al-containing metal film formed on the first Al-containing metal film and having a melting point lower than the melting point of the first Al-containing metal film.

21 Claims, 4 Drawing Sheets

METHOD FOR MANUFACTURING A SEMICONDUCTOR DEVICE HAVING FINE CONTACT HOLE WITH HIGH ASPECT RATIO

This application is a divisional application of Ser. No. 08/578,318, filed Dec. 26, 1995 now U.S. Pat. No. 5,691,571.

BACKGROUND OF THE INVENTION

1. Field of the Invention

The present invention relates to a semiconductor device and a method of manufacturing the same and, more particularly, to a semiconductor device having a fine contact hole with a high aspect ratio, and a method of manufacturing the same.

2. Description of the Prior Art

With micropatterning of a device, the aspect ratio of a contact hole increases. For example, in the case of a 0.35-$\mu$m design rule device, if the thickness of an insulating film exceeds 1.5 $\mu$m, the aspect ratio becomes 4:1 or more. Even if a barrier metal consisting of Ti/TiN or the like is deposited in such a contact hole having a high aspect ratio, and an Al—Si or Al—Si—Cu alloy is sputtered thereon, a fine contact hole having a high aspect ratio cannot be buried.

For example, one method of burying a fine contact hole having a high aspect ratio by depositing a thin Ge film serving as an underlayer on a barrier metal before sputtering Al—Si or Al—Si—Cu is proposed in Japanese Unexamined Patent Publication No. 4-196421. This method utilizes the phenomena that the eutectic temperature of an Al—Ge alloy formed upon an alloying reaction between Ge and Al in a metal wiring layer is lower than that of Al—Si, and the Al—Ge alloy is easily melted and flows into a fine hole. When an Al—Ge-based alloy is sputtered on a thin Ge film at a temperature lower than that for an Al—Si-based alloy, i.e., at a substrate temperature higher than room temperature and equal to or lower than the eutectic temperature of the Al—Ge-based alloy, the Al—Si-based alloy receives Ge during film formation, and an Al—Ge-Si-based alloy easily flows into a hole due to surface migration.

In addition, for example, another method of burying a contact hole having a high aspect ratio, and at the same time decreasing contact resistance by inserting a Ge layer or an Si layer containing Ge at a high concentration between the bottom portion of the contact hole and an underlying barrier metal is proposed in Japanese Unexamined Patent Publication No. 4-196420.

In these conventional devices, however, the resistance of the wiring layer or electrode varies so as to greatly decrease the reliability of device operation.

FIG. 1 shows contact resistance upon burying a contact hole with Al—5%Ge at once. Note that a polysilicon was used as barrier metal. It is found that the resistance shown in FIG. 1 varies 10% or more.

This is because Ge which has alloyed once and is set in a semi-molten state is precipitated on the barrier metal upon cooling to form a nodule.

To decrease the melting point of the alloy, the content of Ge in the alloy must be increased. As a result, a Ge nodule greatly increases in size because the solution concentration of Ge at room temperature is almost 0.

The presence of such a large Ge nodule in a wiring or electrode metal causes variations in resistance with micropatterning of the contact hole, thereby degrading the electrical characteristics of the device.

SUMMARY OF THE INVENTION

The present invention has been made in consideration of the above problem, and has as its object to provide a semiconductor device in which a fine contact hole having a high aspect ratio is buried at a low temperature to form a highly reliable wiring/electrode structure, and a method of manufacturing the same.

The present inventors have found that the above problem can be solved by decreasing the total amount of Ge used for realizing a semi-molten state whereby to suppress the precipitated Ge nodule phenomena.

To achieve the above object, according to the first basic aspect of the present invention, there is provided a semiconductor device comprising at least one hole formed on a semiconductor substrate, a barrier metal formed on at least a portion in contact with the semiconductor substrate in the hole, and a metal interconnection constituted by two layers, which consists of first Al-containing metal film formed on the barrier metal, and a second Al-containing metal film subsequently formed on the first Al-containing metal film and having a melting point lower than a melting point of the first Al-containing metal film.

The semiconductor device described in the first basic aspect has the following aspects.

The first Al-containing metal film comprises one material selected from the group consisting of Al alone, an Al—Si alloy film, and an Al—Si—Cu alloy film.

The second Al-containing metal film comprises one material selected from the group consisting of an Al—Ge—Si alloy film, an Al—Ge—Si—Cu alloy film, an Al—Ge alloy film, an Al—Ge—Cu alloy film, an Al—Sn alloy film, and an Al—Sn—Cu alloy film.

An Si concentration in the Al—Si alloy film is 0.1 to 2 atom %.

An Si concentration in the Al—Si—Cu alloy film is 0.1 to 2 atom %, and a Cu concentration is 0.1 to 2 atom %.

A Ge concentration in the Al—Ge—Si alloy film is 0.5 to 30 atom %, and an Si concentration is 0.1 to 2 atom %.

A Ge concentration in the Al—Ge—Si—Cu alloy film is 0.5 to 30 atom %, an Si concentration is 0.1 to 2 atom %, and a Cu concentration is 0.1 to 2 atom %.

A Ge concentration in the Al—Ge alloy film is 0.5 to 30 atom %.

A Ge concentration in the Al—Ge—Cu alloy film is 0.5 to 30 atom %, and a Cu concentration is 0.1 to 2 atom %.

An Sn concentration in the Al—Sn alloy film is 0.1 to 98 atom %.

Sn and Cu concentrations in the Al—Sn—Cu alloy film are 0.1 to 98 atom % for Si and 0.1 to 2 atom % for Cu.

In addition, to achieve the above object, according to the second basic aspect of the present invention, there is provided a method of manufacturing a semiconductor device having at least one hole in a semiconductor substrate, comprising the steps of forming a barrier metal in the hole and on the semiconductor substrate having an oxide film on a surface, forming a first Al-containing metal film on the barrier metal, subsequently forming a second Al-containing metal film, on the first Al-containing metal film, having a melting point lower than a melting point of the first Al-containing metal film, and setting the second Al-containing metal film in a semi-molten state at an eutectic temperature or less of the second Al-containing metal film to reflow the second Al-containing metal film in the hole, thereby burying the hole.

The method of manufacturing a semiconductor device described in the second basic aspect has the following aspects.

The first Al-containing metal film comprises one material selected from the group consisting of Al alone, an Al—Si alloy film, and an Al—Si—Cu alloy film.

The second Al-containing metal film comprises one material selected from the group consisting of an Al—Ge—Si alloy film, an Al—Ge—Si—Cu alloy film, an Al—Ge alloy film, an Al—Ge—Cu alloy film, an Al—Sn alloy film, and an Al—Sn—Cu alloy film.

An Si concentration in the Al—Si alloy film is 0.1 to 2 atom %.

An Si concentration in the Al—Si—Cu alloy film is 0.1 to 2 atom %, and a Cu concentration is 0.1 to 2 atom %.

A Ge concentration in the Al—Ge—Si alloy film is 0.5 to 30 atom %, and an Si concentration is 0.1 to 2 atom %.

A Ge concentration in the Al—Ge—Si—Cu alloy film is 0.5 to 30 atom %, an Si concentration is 0.1 to 2 atom %, and a Cu concentration is 0.1 to 2 atom %.

A Ge concentration in the Al—Ge alloy film is 0.5 to 30 atom %.

A Ge concentration in the Al—Ge—Cu alloy film is 0.5 to 30 atom %, and a Cu concentration is 0.1 to 2 atom %.

An Sn concentration in the Al—Sn alloy film is 0.1 to 98 atom %.

Sn and Cu concentrations in the Al—Sn—Cu alloy film are 0.1 to 98 atom % for Si and 0.1 to 2 atom % for Cu.

As is understood from the foregoing aspects, the present inventors have given attention to a reflow method (see Proceedings of VLSI Multilevel Interconnection Conference, 1991, pp. 326, and the like) in which a semi-molten state is realized after sputtering to bury a hole, instead of a conventional method in which a semi-molten state is realized on a substrate surface during sputtering to bury a hole. The present inventors could employ the reflow method in the manufacture of a semiconductor device.

It is found from an experiment using low-speed electron diffraction and an analysis using a simulation that, when reflow temperature is increased in this reflow, the surface of the thin deposited-metal film starts melting first.

The present invention has been completed on the following assumption. That is, if only the melting point on the surface of the thin metal film is decreased by alloying Ge, a hole can be buried at a low temperature, and Ge nodule formation can be decreased so as to be negligible. In other words, since reflow occurs on only the surface of the metal film deposited by sputtering, only the film surface is decreased in melting point by adding Ge. As the result, the Ge content is decreased, and Ge is not in contact with a barrier metal. With this arrangement, according to the present invention, the reflow temperature is decreased, and the Ge concentration in the resultant Al film is also decreased. For this reason, according to the present invention, the reliability of the electrode formation and wiring steps of a 0.25-$\mu$m design rule device can be greatly improved.

The above and many other advantages, features and additional objects of the present invention will become manifest to those versed in the art upon making reference to the following detailed description and accompanying drawings in which preferred structural embodiments incorporating the principles of the present invention are shown by way of illustrative example.

DETAILED DESCRIPTION OF PREFERRED EMBODIMENTS

Figure 1:
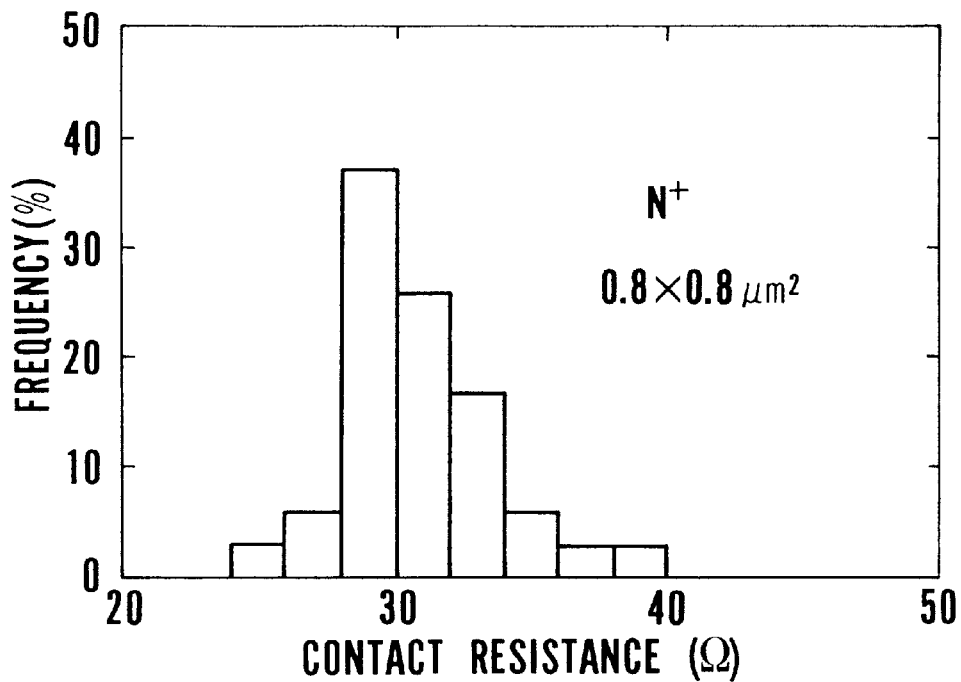
FIG. 1 is a graph showing the variation state of a contact resistance in the prior art.
Figure 2:
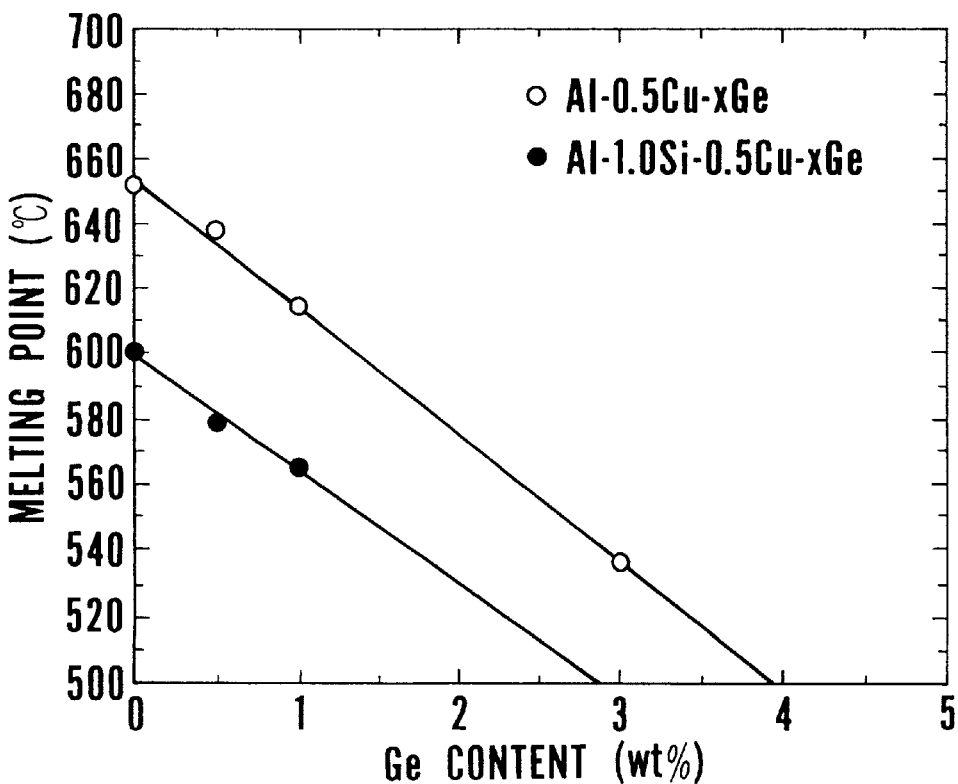
FIG. 2 is a graph showing the dependency of the melting point of an Al—Ge-based alloy on the Ge concentration.
Figure 3A:
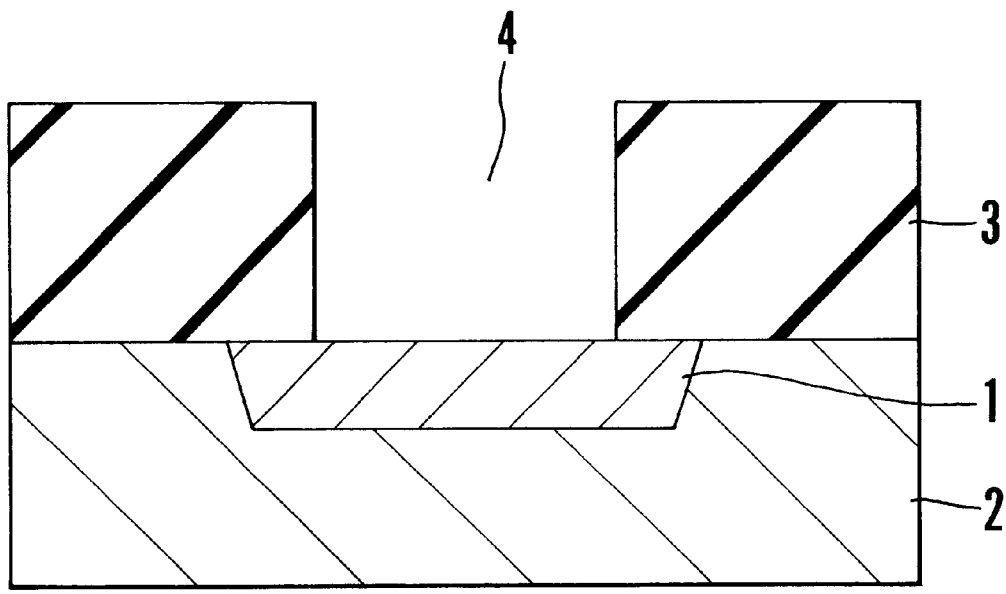
FIGS. 3A to 3D are sectional views sequentially showing the steps of a method of manufacturing a semiconductor device according to an embodiment of the present invention.
Figure 3B:
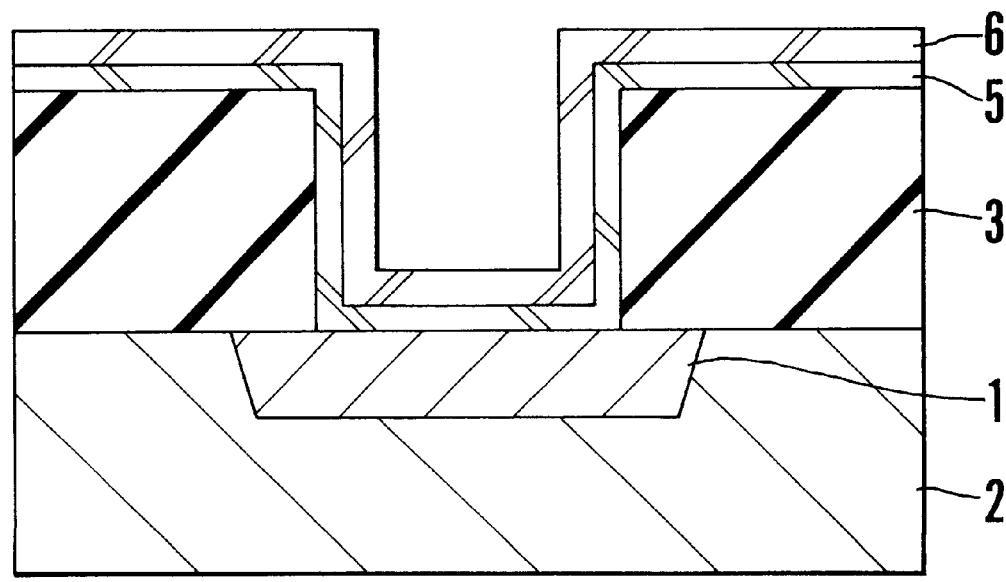
Figure 3C:
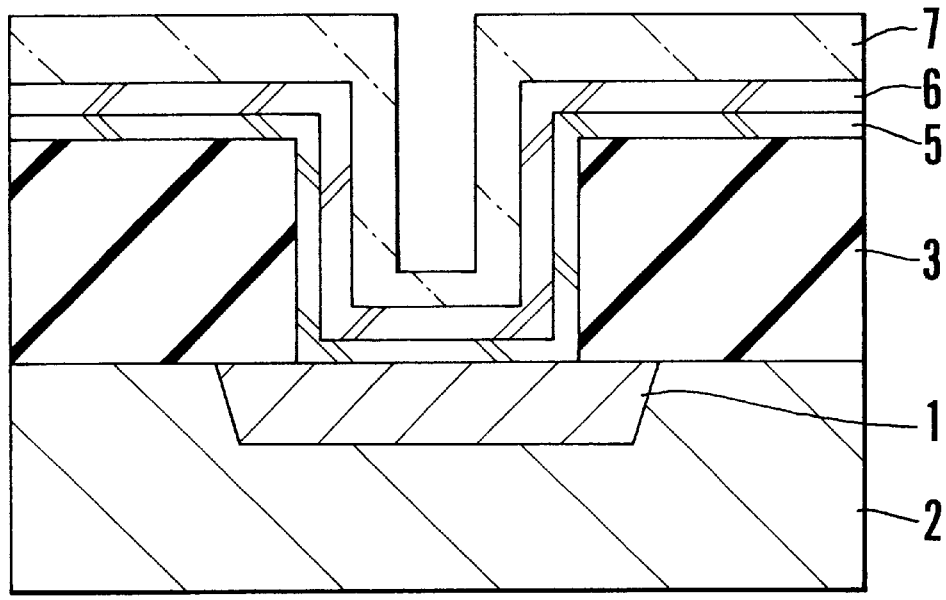
Figure 3D:
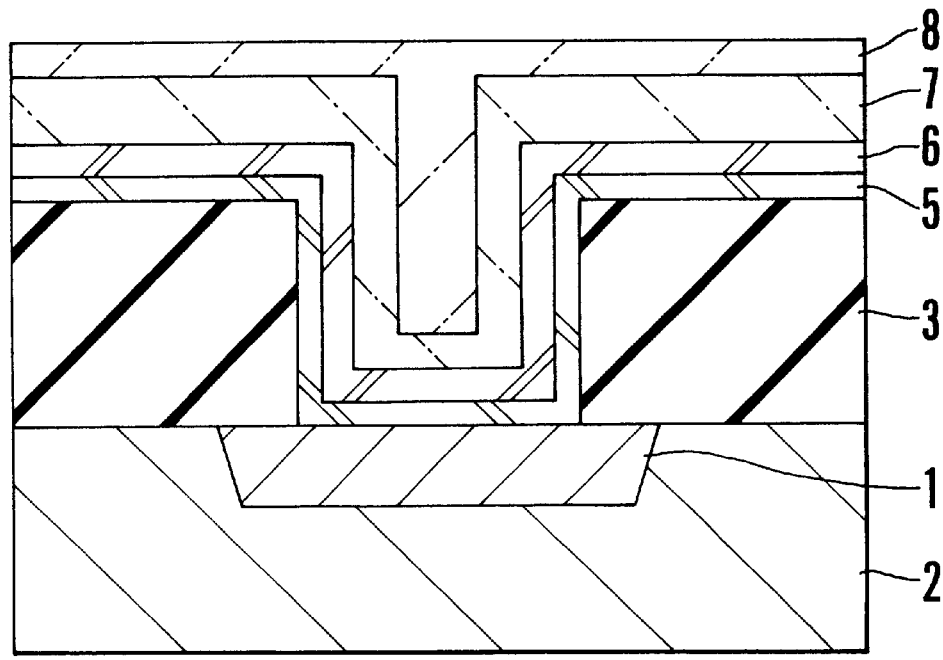

An embodiment of the present invention will be described in detail below with reference to the accompanying drawings (FIGS. 3A to 3D).

FIGS. 3A to 3D are sectional views sequentially showing the steps in manufacturing a semiconductor device according to one embodiment of the present invention.

An oxide film 3 is formed by CVD or the like on an Si substrate 2 having one surface in which a $p^+$ diffusion layer 1 serving as part of an element such as a transistor is formed. The oxide film 3 is etched to form a contact hole 4 having a diameter of 0.25 $\mu$m and an aspect ratio of 4 (see FIG. 3A).

After a thin Ti film 5 is formed so as to a thickness of 20 nm at room temperature by sputtering, a thin TiN film 6 is formed so as to a thickness of 100 nm at a substrate temperature of 200° C. by sputtering. The resultant structure is annealed with a lamp in an nitrogen atmosphere at 620° C. for 30 sec (see FIG. 3B). Note that the Ti and TiN stacked films 5 and 6 function as barrier metals.

Further, an Al—Si alloy film containing 1 atom % of Si, or an Al—Si—Cu alloy film containing 1 atom % of Si and 0.5 atom % of Cu is formed as a first Al-containing metal film 7 to a thickness of 0.8 $\mu$m on the barrier metals 5 and 6 by sputtering, while the substrate 1 is heated to 20 to 100° C. (see FIG. 3C).

Subsequently, an Al—Ge—Si alloy film containing 20 atom % of Ge and 1 atom % of Si, or an Al—Ge—Si—Cu alloy film containing 20 atom % of Ge, 1 atom % of Si, and 0.5 atom % of Cu is formed as a second Al-containing metal film 8 having a melting point lower than that of the first Al-containing metal film 7 so as to a thickness of 0.01 $\mu$m on the first Al-containing metal film 7 by sputtering, while the substrate 1 is heated to 20 to 100° C. Thereafter, the second Al-containing metal film 8 is reflowed at 300° C. (see FIG. 3D).

Figure 4:
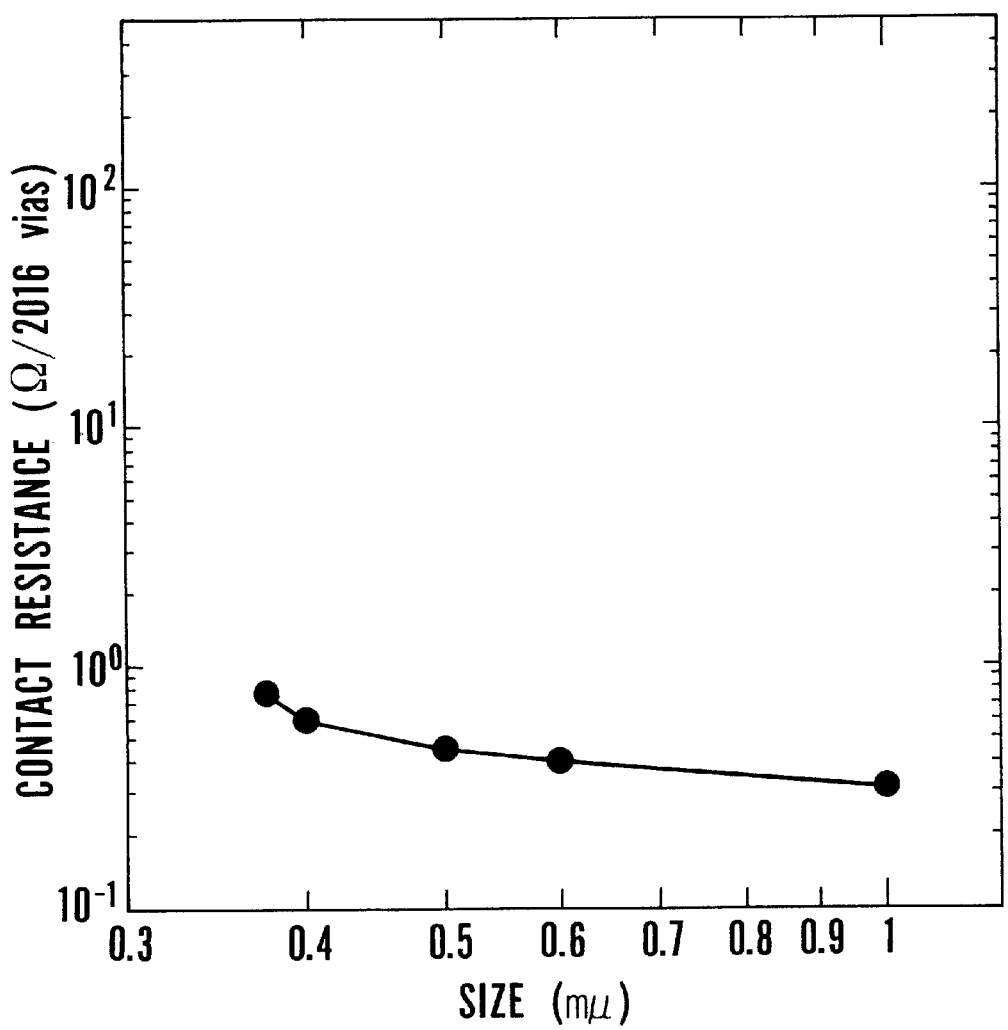
FIG. 4 is a graph showing the variation state of a contact resistance in the present invention.

As a result, the contact hole 4 is completely buried. At this time, as is clearly understood from the graph shown in FIG. 4, variation in resistance of a wiring layer or an electrode is suppressed to 10% or less. It is found that the problem of decreased reliability is solved.

Even if an Al film formed of Al alone is used as the first Al-containing metal film 7, exactly the same effect can be obtained.

In addition, even if an Al—Ge alloy film, an Al—Ge—Cu film, an Al—Sn film, or an Al—Sn—Cu film containing no Si is used as the second Al-containing metal film 8, the effect is found to be the same.

Further, it is found that the object of the present invention can be achieved, if the Si and Cu concentrations in the first Al-containing metal film 7 fall within a range of 0.1 to 2 atom %, respectively.

Still further, it is found that the object of the present invention can be achieved, if the Ge concentration in the second Al-containing metal film 8 falls within a range of 0.5 to 30 atom %, and the Si or Sn concentration and the Cu concentration fall within a range of 0.1 to 2 atom % for Si, 0.1 to 98 atom % for Sn and 0.1 to 2 atom % for Cu.

As has been described above, according to the present invention, a fine contact hole having a high aspect ratio can be completely buried. At this time, the device characteristics and reliability of the semiconductor device can be improved without degrading electrical characteristics.

According to the present invention, since a fine contact hole can be buried by conventional sputtering, a conventional manufacturing process can be directly used to decrease the manufacturing cost.

In the prior art, a wafer serving as a substrate must be heated to 450° C. or more in order to reflow a second Al-containing metal film. To the contrary, in the present invention, the second Al-containing metal film can be reflowed at a temperature much lower than the conventional temperature, e.g., at a substrate heating temperature of 300° C. Therefore, the device characteristics and reliability of a semiconductor device can be greatly improved.

The above description is merely the illustration of a preferred embodiment of the invention, and the scope and spirit of the invention are not limited to this. It is to be understood that various changes and modifications of the invention may be effected by one skilled in the art without departing from the spirit and scope of the invention.

What we claimed is:

1. A method of manufacturing a semiconductor device having at least one hole in a semiconductor substrate, comprising the steps in sequence of: forming a barrier metal in the hole and on said semiconductor substrate having an oxide film on a surface; forming a first Ge-free Al-containing metal film on said barrier metal; subsequently forming a second Al-containing metal film, on said first Ge-free Al-containing metal film, said second Al-containing metal film having a melting point lower than a melting point of said first Ge-free Al-containing metal film; and setting said second Al-containing metal film in a semi-molten state at not more than an eutectic temperature of said second Al-containing metal film to reflow said second Al-containing metal film in the hole, thereby burying completely said second Al-containing metal film in the hole.

2. A method according to claim 1, wherein said first Ge-free Al-containing metal film is selected from the group consisting of an Al film, an Al—Si alloy film, and an Al—Si—Cu alloy film.

3. A method according to claim 1, wherein said second Al-containing metal film is selected from the group consisting of an Al—Ge—Si alloy film, an Al—Ge—Si—Cu alloy film, an Al—Ge alloy film, an Al—Ge—Cu alloy film, an Al—Sn alloy film, and an Al—Sn—Cu alloy film.

4. A method according to claim 2, wherein the Si concentration in said Al—Si alloy film is 0.1 to 2 atom %.

5. A method according to claim 2, wherein the Si concentration in said Al—Si—Cu alloy film is 0.1 to 2 atom %, and the Cu concentration is 0.1 to 2 atom %.

6. A method according to claim 3, wherein the Ge concentration in said Al—Ge—Si alloy film is 0.5 to 30 atom %, and the Si concentration is 0.1 to 2 atom %.

7. A method according to claim 3, wherein the Ge concentration in said Al—Ge—Si—Cu alloy film is 0.5 to 30 atom %, the Si concentration is 0.1 to 2 atom %, and the Cu concentration is 0.1 to 2 atom %.

8. A method according to claim 3, wherein the Ge concentration in said Al—Ge alloy film is 0.5 to 30 atom %.

9. A method according to claim 3, wherein the Ge concentration in said Al—Ge—Cu alloy film is 0.5 to 30 atom %, and the Cu concentration is 0.1 to 2 atom %.

10. A method according to claim 3, wherein the Sn concentration in said Al—Sn alloy film is 0.1 to 98 atom %.

11. A method according to claim 3, wherein the Sn and Cu concentration in said Al—Sn—Cu alloy film are 0.1 to 98 atom % for Sn and 0.1 to 2 atom % for Cu.

12. A method according to claim 1, wherein said first Ge-free Al-containing metal film is selected from the group consisting of an Al film, an Al—Si alloy film and an Al—Si—Cu alloy film, and said second Al-containing metal film is selected from the group consisting of an Al—Ge—Si alloy film, an Al—Ge—Si—Cu alloy film, an Al—Ge alloy film, an Al—Ge—Cu alloy film, an Al—Sn alloy film and an Al—Sn—Cu alloy film.

13. A method according to claim 12, wherein the Si concentration in said Al—Si alloy film is 0.1 to 2 atom %.

14. A method according to claim 12, wherein the Si concentration in said Al—Si—Cu alloy film is 0.1 to 2 atom %.

15. A method according to claim 12, wherein the Ge concentration in said Al—Ge—Si alloy film is 0.5 to 30 atom %, and the Si concentration therein is 0.1 to 2 atom %.

16. A method according to claim 12, wherein the Ge concentration in said Al—Ge alloy film is 0.5 to 30 atom %, the Si concentration therein is 0.1 to 2 atom %, and the Cu concentration therein is 0.1 to 2 atom %.

17. A method according to claim 12, wherein the Ge concentration in said Al—Ge alloy film is 0.5 to 30 atom %.

18. A method according to claim 12, wherein the Ge concentration in said Al—Ge—Cu alloy film is 0.5 to 30 atom %, and the Cu concentration therein is 0.1 to 2 atom %.

19. A method according to claim 12, wherein the Sn concentration in said Al—Sn alloy film is 0.1 to 98 atom %.

20. A method according to claim 12, wherein the Sn and Cu concentrations in said Al—Sn—Cu alloy film is 0.1 to 98 atom % for Sn and 0.1 to 2 atom % for Cu.

21. A method of manufacturing a semiconductor device having at least one hole in a semiconductor substrate, comprising the steps in sequence of: forming a barrier metal in said hole and on said semiconductor substrate having an oxide film on its surface; forming a first Ge-free Al-containing metal film by sputtering on said barrier metal so as not to completely bury said first Ge-free Al-containing metal film in said hole; subsequently forming a second Al-containing metal film, by sputtering on said first Ge-free Al-containing metal film, having a melting point lower than a melting point of said first Ge-free Al-containing metal film; and setting said second Al-containing metal film in a semi-molten state at not more than an eutectic temperature of said second Al-containing metal film to reflow said second Al-containing metal film in said hole, thereby burying completely said second Al-containing metal film in said hole.

* * * * *